US008648654B1

(12) United States Patent
Myers et al.

(10) Patent No.: US 8,648,654 B1
(45) Date of Patent: Feb. 11, 2014

(54) INTEGRATED CIRCUIT AND METHOD FOR GENERATING A LAYOUT OF SUCH AN INTEGRATED CIRCUIT

(71) Applicant: Arm Limited, Cambridge (GB)

(72) Inventors: James E Myers, Bottisham (GB); John P Biggs, Teversham (GB); David W Flynn, Cambridge (GB); David W Howard, Fen Ditton (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/626,188

(22) Filed: Sep. 25, 2012

(51) Int. Cl.
H01L 25/00 (2006.01)
(52) U.S. Cl.
USPC .......................................................... 327/565
(58) Field of Classification Search
USPC .......................... 327/530, 534–543, 564–566
See application file for complete search history.

(56) References Cited

U.S. PATENT DOCUMENTS

| 6,373,325 | B1 * | 4/2002 | Kuriyama ...................... 327/536 |
| 8,239,700 | B2 * | 8/2012 | Nation et al. ................. 713/324 |
| 2012/0169412 | A1 * | 7/2012 | Dettloff et al. ................ 327/538 |

OTHER PUBLICATIONS

H. Homayoun et al., "On leakage power optimization in clock tree networks for ASICs and general-purpose processors", Sustainable Computing Informatics and Systems 1, 2011, pp. 75-87.
Y. Shin et al., "Cell-Based Semicustom Design of Zigzag Power Gating Circuits", Proceedings of the 8th International Symposium on Quality Electronic Design (ISQED'07), IEEE, 2007, 6 pages.

* cited by examiner

Primary Examiner — Lincoln Donovan
Assistant Examiner — Sibin Chen
(74) Attorney, Agent, or Firm — Nixon & Vanderhye P.C.

(57) ABSTRACT

An integrated circuit has a first and second voltage supply rails with first and second voltage levels and a gated voltage supply rail. Each of the circuit elements is connected either between the first and second voltage supply rails or between the gated rail and the second voltage rail. A source circuit structure comprising one or more circuit elements provides an input signal maintained at a static value during a power gated mode of operation. At least one recipient circuit structure requires receipt of the input signal at the static value during the power gated mode of operation. A distribution network comprises a first subset of circuit elements which pull their output to the first voltage level then the input signal has the static value, and a second subset of circuit elements which pull their output to the second voltage level when the input signal has the static value.

16 Claims, 13 Drawing Sheets

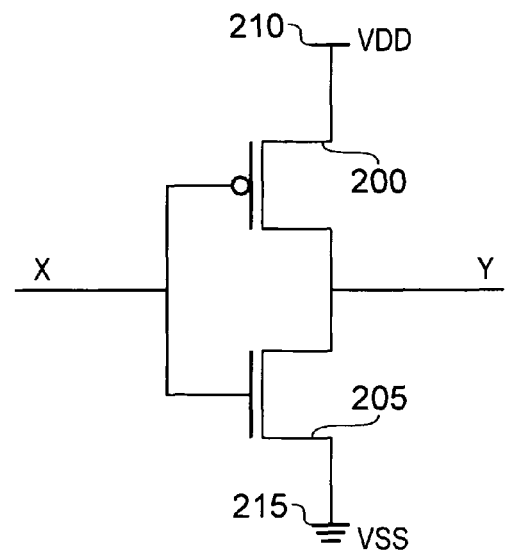
FIG. 4
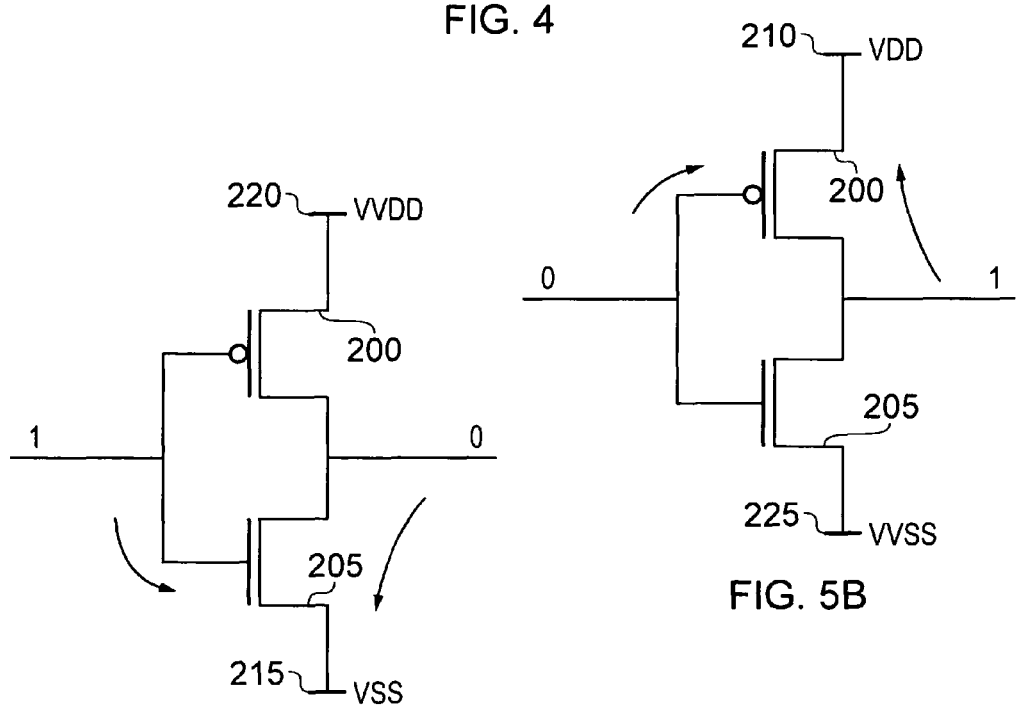
FIG. 5A
FIG. 5B

NOR

IF A=1,
Y WILL BE PULLED
TO GROUND
IRRESPECTIVE OF
VALUE OF B

NAND

IF A=0,
Y WILL BE PULLED
TO VDD
IRRESPECTIVE OF
VALUE OF B

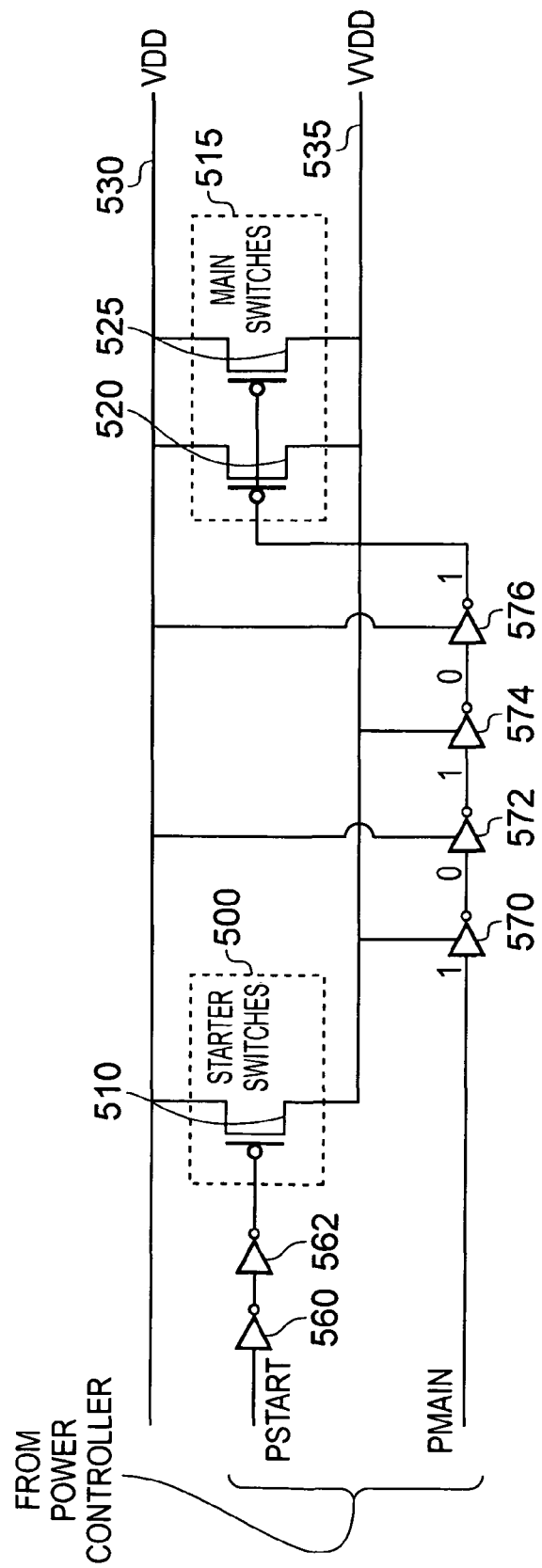

INTEGRATED CIRCUIT AND METHOD FOR GENERATING A LAYOUT OF SUCH AN INTEGRATED CIRCUIT

BACKGROUND OF THE INVENTION

1. Field of the Invention

The present invention relates to an integrated circuit, and to a method of generating a layout of such an integrated circuit, and in particular to a technique for reducing the leakage current within such an integrated circuit.

2. Description of the Prior Art

In order to reduce dynamic power consumption within an integrated circuit, one technique employed is to turn off the clock signal to one or more components when those components are not required. By turning off the clock signal, no switching occurs within those components, and accordingly the dynamic power consumption is reduced.

However, power consumption can also arise due to leakage current, and accordingly even though the dynamic power can be reduced by turning off the clock to certain components, those components may provide leakage current paths which contribute to the overall power consumption, and hence the overall energy consumption, of the integrated circuit.

With the aim of reducing leakage current, it is known to employ power gating techniques to remove a power supply to certain circuit elements when they are not being used, so as to avoid them contributing to leakage current. Typically each of the circuit elements will be connected between two supply rails, one of the supply rails providing a power supply voltage level and the other supply rail providing a ground voltage level. In accordance with a known power gating technique, a gated supply rail is provided which is connected via power switches to one of the non-gated supply rails. Hence, by way of example, a gated VDD (power supply) rail can be provided by connecting that gated power supply rail to the non-gated VDD power rail via header switches. For any circuit elements that it is desired to power off during a power gated mode of operation, those circuit elements are connected between the gated VDD supply rail and the ground supply rail, rather than between the non-gated VDD supply rail and the ground supply rail. During a power gated mode of operation, the header switches are then turned off, causing the gated power supply rail to be disconnected from the non-gated power supply rail, thus removing the power from any circuit elements connected to that gated power supply rail.

As an alternative to gating the power supply rail, a gated ground supply rail can be created which is connected to the non-gated ground supply rail via footer switches. Circuit elements to be powered off in the power gating mode of operation are then connected between the non-gated VDD supply rail and the gated ground supply rail.

While such an approach can significantly reduce the leakage current, an issue that can arise is that the output from circuit elements that have been power gated can tend to float, i.e. the output voltage level transitions to a point between the logic one (VDD) and the logic zero (ground) level. Whilst this is not necessarily an issue if the output from a power gated circuit element is only received by other circuit elements that are also power gated, if an output from a power gated circuit element is provided as an input to another circuit element which is not power gated, then the floating nature of the output from the power gated circuit element can cause incorrect operation of the integrated circuit.

To address this issue, it is known to provide distribution networks to provide a predetermined static value as an input to any circuit structures containing a power gated circuit element whose output may be received by a non power gated circuit element, with that predetermined static value being chosen to ensure that the output from the power gated circuit element cannot adversely impact correct operation of the non power gated circuit element. In known systems, the circuit elements forming such distribution networks remain powered during the power gating mode of operation to ensure that the required predetermined static value is provided to the necessary power gated circuit elements.

An alternative power gating approach which has been the subject of significant academic research is referred to as zig-zag power gating. In accordance with the zig-zag mechanism, the above distribution networks are not required, since the zig-zag mechanism ensures that none of the gated circuit elements can have their output at a floating voltage level. Instead, a known sleep state is architected for the entire power-gated region of the integrated circuit which ensures that every circuit element to be power gated receives an input that will cause its output not to float. Every circuit element then has one of its supply rails provided by a gated supply rail that is turned off in the power gating mode of operation.

Two example papers which discuss zigzag power gating techniques are "Cell-Based Semicustom Design of Zigzag Power Gating Circuits" by Shin et al Proceedings of the Eighth International Symposium on Quality Electronic Design (ISQED '07) and "On leakage power optimization in clock tree networks for ASICs and general-purpose processors" by Homayoun el al, Sustainable Computing: Informatics and Systems 1 (2011), pages 75 to 87.

Whilst such zig-zag power gating techniques achieve significant reductions in leakage current, and avoid any power gated circuit elements having a floating output, they require both a gated power supply rail and a gated ground rail in addition to the non-gated power supply rail and non-gated ground rail, and in many production integrated circuits the power routing overhead of providing two such switched supplies cannot be afforded. In addition the zig-zag power gating approach requires a known sleep state to be architected for all of the circuit elements to be power gated. In practice, it can be very difficult to achieve such a known sleep state. For example, it is difficult for general purpose processors to have a known sleep state without very significant software effort.

For the above reasons, in many practical implementations it is not possible to implement zig-zag power gating, and instead the earlier-mentioned power gating approach is used, where a single gated supply rail is provided (either a gated VDD rail or a gated ground rail), and distribution networks of circuit elements are used where necessary to ensure that any gated circuit elements whose outputs could affect the correct operation of non-gated circuit elements during the power gated mode of operation have their outputs decoupled from the non-gated circuit elements or are forced to produce outputs that do not float when they are power gated.

However, as mentioned earlier, the circuit elements forming such distribution networks are powered during the power gated mode to ensure that the correct static value is provided to the necessary power gated circuit elements. As a result the circuit elements forming these distribution networks can contribute to leakage current during the power gated mode of operation. As process geometies shrink, the issue of leakage current is becoming more and more significant, and as a result the amount of leakage current resulting from such distribution networks is becoming a cause for concern. Accordingly, it would be desirable to provide a technique for reducing leakage current when such distribution networks are used in power gated modes of operation of the integrated circuit.

SUMMARY OF THE INVENTION

Viewed from a first aspect the present invention provides an integrated circuit comprising: a first voltage supply rail configured to provide a first voltage level; a second voltage supply rail configured to provide a second voltage level; a gated voltage supply rail configured during at least one mode of operation of the integrated circuit to be connected to said first voltage supply rail, and configured during a power gated mode of operation of the integrated circuit to be disconnected from said first voltage supply rail; a plurality of circuit elements, at least one of the circuit elements being connected to said first voltage supply rail and said second voltage supply rail such that said at least one of the circuit elements remains powered during said power gated mode of operation, and at least one other of the circuit elements being connected to said gated voltage supply rail and said second voltage supply rail such that said at least one other of the circuit elements is powered off during said power gated mode of operation; a source circuit structure configured to provide an input signal and to maintain said input signal at a static value during said power gated mode of operation; at least one recipient circuit structure that requires receipt of said input signal at said static value during said power gated mode of operation; and a distribution network of circuit elements configured to route said input signal from said source circuit structure to said at least one recipient circuit structure, said distribution network comprising a first subset of circuit elements and a second subset of circuit elements, when the input signal has said static value, each circuit element in said first subset being configured to pull its output to the first voltage level, and each circuit element in the second subset being configured to pull its output to the second voltage level, each circuit element in said first subset being connected to said first voltage supply rail and said second voltage supply rail, but at least one of the circuit elements in said second subset being connected to said gated voltage supply rail and said second voltage supply rail; whereby the distribution network provides the static value to said at least one recipient circuit structure during said power gated mode of operation even though said at least one of the circuit elements in said second subset is powered off during said power gated mode of operation.

In accordance with the present invention, when the individual circuit elements forming the distribution network are to be connected to a power supply, it is first determined whether those circuit elements fall within a first subset or a second subset, dependent on which voltage level their output will be pulled to when the predetermined static value is propagated through the distribution network during the power gated mode of operation. In particular, if in that situation a circuit element's output will be pulled to the first voltage level, it is considered to reside within a first subset of the circuit elements, whereas if its output will be pulled to the second voltage level, it is considered to reside within a second subset. Any circuit element determined to be in the first subset is then connected to the first voltage supply rail and the second voltage supply rail, and accordingly will be powered during the power gating mode of operation. However, at least one of the circuit elements in the second subset is connected to the gated voltage supply rail and the second voltage supply rail, such that it will not be powered during the power gated mode of operation, and hence will not contribute to leakage current. Since it is known that such a circuit element in the second subset will have its output pulled to the second voltage level when the static value is propagated through the distribution network, the turning off of that element does not cause any problems, since its output will be naturally pulled towards the second voltage level anyway, and the second voltage supply rail provided to that circuit element is not gated, hence ensuring that functionality is maintained. Thus, the distribution network continues to provide the required static value to each recipient circuit structure during the power gated mode of operation even though at least one of the circuit elements in the second subset is powered off during the power gated mode of operation. As a result, this enables the leakage current associated with the distribution network to be reduced during the power gated mode of operation without any effect on correct operation.

Whilst in one embodiment only one or some of the circuit elements in the second subset will be connected to the gated voltage supply rail and the second voltage supply rail, in one particular embodiment all of the circuit elements in the second subset are connected to the gated voltage supply rail and the second voltage supply rail, this configuration ensuring the most significant reductions in leakage current.

Each recipient circuit structure may in one embodiment contain a single circuit element. However, in alternative embodiments each recipient circuit structure comprises multiple circuit elements, and at least one of said multiple circuit elements is connected to said gated voltage supply rail and said second voltage supply rail. Whilst the recipient circuit structure will typically reside within a power gated region of the integrated circuit, not all of its circuit elements need necessarily be power gated. Hence, the recipient circuit structure as a whole may be connected to both the first voltage supply rail and the gated voltage supply rail, along with the second voltage supply rail, with individual circuit elements within the recipient circuit structure then being connected either to the first voltage supply rail and the second voltage supply rail, or to the gated voltage supply rail and the second voltage supply rail, dependent on whether those independent circuit elements are to be power gated during the power gated mode of operation or not.

In one embodiment, each recipient circuit structure may incorporate an end portion of the distribution network, with that end portion of the distribution network comprising at least one of the circuit elements in the second subset. Hence, in such an arrangement, the above described technique reduces leakage current not only within circuit elements of the distribution network external to each recipient circuit structure, but also reduces leakage current within each recipient circuit structure due to the presence of an end portion of the distribution network within each recipient circuit structure.

The recipient circuit structures can take a variety of forms. However, in one embodiment each recipient circuit structure comprises a flip-flop cell comprising as circuit elements a master latch and a slave latch, one of the master latch and the slave latch being connected to said first voltage supply rail and said second voltage supply rail so as to remain powered and act as a retention latch in said power gated mode of operation, and the other of said master latch and said slave latch being connected to said gated voltage supply rail and said second voltage supply rail so as to be powered off during said power gated mode of operation. Such a design of flip-flop cell uses either the master latch or the slave latch to provide data retention during the power gated mode of operation, rather than relying on a separate retention latch provided in alternative designs. Due to the ability to avoid a separate retention latch, such an approach provides an area and performance optimal design which can be useful in certain implementations. However, it does require the use of a distribution network to provide a particular static value to the flip-flop cell during the power gated mode of operation to ensure that the latch providing the retention latch functionality cannot have its internal state corrupted due to the circuit elements that have been power gated within the flip-flop cell. However, when using the above described techniques, the leakage current associated with that distribution network can be reduced due to the ability to power gate certain circuit elements of the distribution network.

Considering one particular example where the slave latch acts as the retention latch, the flip-flop cell may comprise a coupling element used to selectively connect the output of the master latch to the input of the slave latch in dependence on a clock signal, the flip-flop cell using the input signal as said clock signal, and the static value of the input signal during said power gated mode of operation causing the coupling element to disconnect the output of the master latch from the input of the slave latch during the power gated mode of operation. Hence, in this embodiment, the supply of the predetermined static value ensures that the power gated master latch cannot corrupt the state held within the slave latch, the slave latch continuing to be powered during the power gated mode of operation.

Whilst the clock signal is one example of a signal that needs to be maintained at a predetermined static value for the above mentioned flip-flop cell when in the power gated mode of operation, it may not be the only signal that needs to be held at a static value. For example, if the flip-flop cell supports a reset operation, then the master latch and slave latch will be configured to receive a reset signal which, when asserted, resets the stored state of those master and slave latches. It is hence important to ensure that the reset signal is held at a value that will not corrupt the state of the latch used as a retention latch during the power gated mode of operation. In one embodiment, this can be achieved by the flip-flop cell using an input signal provided over a distribution network as the reset signal, with that input signal being held at a static value during the power gated mode of operation to ensure that the reset signal is de-asserted during the power gated mode of operation.

In one particular embodiment, there may be two separate distribution networks providing static signals to the flip-flop cell during the power gated mode of operation, the first distribution network providing a static value of the clock signal, and the second distribution network providing a static value of the reset signal. Both of these distribution networks can reduce leakage current using the above described mechanisms to turn off at least some of the circuit elements forming those distribution networks during the power gated mode of operation.

In embodiments where every circuit element in the second subset is power gated (i.e. is connected to the gated voltage supply rail and the second voltage supply rail), then in one embodiment the circuit elements of the first subset are interleaved with the circuit elements of the second subset, such that every alternate circuit element within the distribution network is connected to the gated voltage supply rail and the second voltage supply rail. In such an arrangement, approximately 50% of the leakage current that would otherwise occur within the distribution network can be removed.

The source circuit structure can take a variety of forms. However, in one embodiment the source circuit structure comprises multiple circuit elements, and at least one of said multiple circuit elements is connected to said first voltage supply rail and said second voltage supply rail to ensure that said static value is produced during said power gated mode of operation. Hence, the source circuit structure may be provided either within a non power gated region of the integrated circuit, or within a power gated region of the integrated circuit. However, if it is provided within a power gated region of the integrated circuit, at least one of the circuit elements will remain powered during the power gated mode of operation to ensure that the required static value is generated.

In an alternative embodiment, the input signal may be generated externally to the integrated circuit and the source circuit structure may comprise at least one circuit element connected to said first voltage supply rail and said second voltage supply rail and used to buffer the input signal prior to routing of that input signal via said distribution network. In such an arrangement, the source circuit structure will remain powered during the power gated mode of operation to ensure that the required static value is output over the distribution network.

In one embodiment, the first voltage level is a power supply voltage level and the second voltage level is a ground voltage level. However, in an alternative embodiment, the first voltage level may be a ground voltage level and the second voltage level may be a power supply voltage level, such that in this alternative embodiment it is the ground voltage level that is gated.

Whilst an example where each recipient circuit structure comprises a flip-flop cell has been discussed above, the recipient circuit structures to which the present technique can be applied can be very varied. For example, considering an alternative embodiment, the integrated circuit further comprises a plurality of power switches arranged in parallel between said first voltage supply rail and said gated voltage supply rail, and configured to disconnect the gated voltage supply rail from said first voltage supply rail during said power gated mode of operation. A subset of said power switches form said at least one recipient circuit structure, and said distribution network is configured to provide said input signal as a gate control signal to said subset of said power switches, said static value provided during said power gated mode of operation ensuring that said subset of said power switches are turned off during said power gated mode of operation. Hence, in that embodiment, a subset of the power switches that are actually used to connect and disconnect the gated voltage supply rail from the first voltage supply rail can themselves form the recipient circuit structure, with the distribution network in that embodiment then being the series of circuit elements used to propagate a gate control signal for those power switches from a power control source to those power switches. During the power gated mode of operation, that distribution network will need to ensure that a static value is provided to the gates of those power switches, to ensure that those power switches remain off during the power gated mode of operation. In accordance with the above described technique, certain of the circuit elements within the distribution network can themselves be connected to the gated voltage supply rail, hence causing those circuit elements to be turned off during the power gated mode of operation.

Viewed from a second aspect, the present invention provides a method of generating a layout of an integrated circuit, comprising: arranging a first voltage supply rail to provide a first voltage level; arranging a second voltage supply rail to provide a second voltage level; arranging a gated voltage supply rail to be connected to said first voltage supply rail during at least one mode of operation of the integrated circuit, and to be disconnected from said first voltage supply rail during a power gated mode of operation of the integrated circuit; providing a plurality of circuit elements, with at least one of the circuit elements being connected to said first voltage supply rail and said second voltage supply rail such that said at least one of the circuit elements remains powered during said power gated mode of operation, and with at least one other of the circuit elements being connected to said gated voltage supply rail and said second voltage supply rail such that said at least one other of the circuit elements is powered off during said power gated mode of operation; and during said step of providing said plurality of circuit elements, performing the steps of: arranging a source circuit structure to provide an input signal and to maintain said input signal at a static value during said power gated mode of operation; providing at least one recipient circuit structure that requires receipt of said input signal at said static value during said power gated mode of operation; providing a distribution network of circuit elements to route said input signal from said source circuit structure to said at least one recipient circuit structure; determining a first subset of circuit elements within said distribution network which, when the input signal has said static value, will pull their output to the first voltage level; determining a second subset of circuit elements within said distribution network which, when the input signal has said static value, will pull their output to the second voltage level; connecting each circuit element in said first subset to said first voltage supply rail and said second voltage supply rail; and connecting at least one of the circuit elements in said second subset to said gated voltage supply rail and said second voltage supply rail; whereby the distribution network provides the static value to said at least one recipient circuit structure during said power gated mode of operation even though said at least one of the circuit elements in said second subset is powered off during said power gated mode of operation.

Hence, in accordance with the above second aspect of the present invention, the determination for each circuit element of the distribution network as to whether that circuit element is within the first subset or within the second subset, along with the resultant connection of that circuit element to either the first voltage supply rail and the second voltage supply rail, or to the gated voltage supply rail and the second voltage supply rail, can be automated within the tool used to generate the layout of the integrated circuit.

Viewed from a third aspect, the present invention provides a storage medium providing a computer program which when executed on a computer causes the computer to perform a method of generating a layout of an integrated circuit in accordance with the second aspect of the present invention. The storage medium can take a variety of forms, but in one embodiment is a non-transitory storage medium.

Viewed from a fourth aspect, he present invention provides an integrated circuit comprising: first voltage supply rail means for providing a first voltage level; second voltage supply rail means for providing a second voltage level; gated voltage supply rail means for connecting to said first voltage supply rail means during at least one mode of operation of the integrated circuit, and for disconnecting from said first voltage supply rail means during a power gated mode of operation of the integrated circuit; a plurality of circuit element means, at least one of the circuit element means for connecting to said first voltage supply rail means and said second voltage supply rail means such that said at least one of the circuit element means remains powered during said power gated mode of operation, and at least one other of the circuit element means for connecting to said gated voltage supply rail means and said second voltage supply rail means such that said at least one other of the circuit element means is powered off during said power gated mode of operation; source circuit means for providing an input signal and to maintain said input signal at a static value during said power gated mode of operation; at least one recipient circuit means that requires receipt of said input signal at said static value during said power gated mode of operation; a distribution means formed of circuit element means for routing said input signal from said source circuit means to said at least one recipient circuit means, said distribution means comprising a first subset of circuit element means and a second subset of circuit element means, when the input signal has said static value, each circuit element means in said first subset for pulling its output to the first voltage level, and each circuit element means in the second subset for pulling its output to the second voltage level, each circuit element means in said first subset being connected to said first voltage supply rail means and said second voltage supply rail means, but at least one of the circuit element means in said second subset being connected to said gated voltage supply rail means and said second voltage supply rail means; whereby the distribution means provides the static value to said at least one recipient circuit means during said power gated mode of operation even though said at least one of the circuit element means in said second subset is powered off during said power gated mode of operation.

BRIEF DESCRIPTION OF THE DRAWINGS

The present invention will be described further, by way of example only, with reference to embodiments thereof as illustrated in the accompanying drawings, in which:

FIG. 4 schematically illustrates an inverter that can be used to implement at least some of the circuit elements provided within the distribution network;

FIG. 5A illustrates how each inverter presented at its input with a logic one value when the signal generation circuit produces a predetermined static value can be safely power gated in accordance with one embodiment where the integrated circuit has a gated VDD supply rail.

FIG. 5B illustrates how each inverter presented at its input with a logic zero value when the signal generation circuit produces a predetermined static value can be safely power gated in accordance with one embodiment where the integrated circuit has a gated ground supply rail;

FIG. 11 illustrates a yet further embodiment where the signal generation circuit is a power controller, the distribution network is a series of inverters used to propagate a power control signal to the main switches of a header switch structure used to selectively connect and disconnect the gated VDD voltage supply rail from the non-gated VDD voltage supply rail, and the main switches form the recipient circuit structure;

DESCRIPTION OF EMBODIMENTS

Figure 1A:
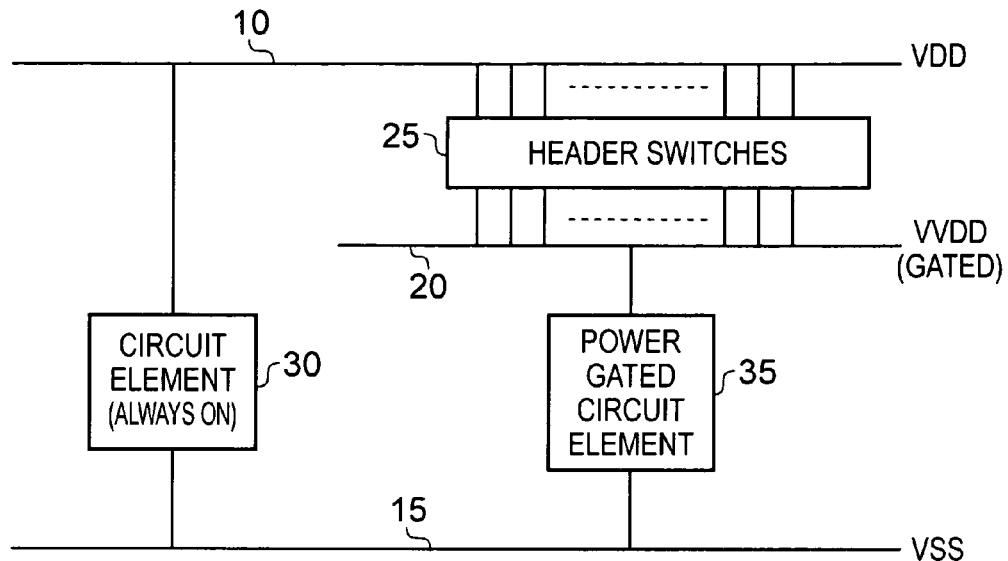
FIGS. 1A and 1B are diagrams schematically illustrating how a gated voltage supply rail can be established within an integrated circuit in accordance with two different embodiments.

FIG. 1A schematically illustrates how a gated VDD voltage supply rail (also referred to as a virtual VDD voltage supply rail) 20 may be established within an integrated circuit. In particular, the integrated circuit is provided with a VDD voltage supply rail 10 for providing the supply voltage level VDD and a ground voltage supply rail 15 for providing the ground voltage level VSS. Header switches 25 (typically formed by a plurality of PMOS transistors in parallel) are used to selectively connect and disconnect the VDD supply rail 10 to the gated voltage supply rail VVDD 20. In particular, when the header switches are turned on, they connect the VDD supply rail 10 to the VVDD supply rail 20, whereas when the header switches are turned off, they disconnect the VVDD supply rail 20 from the VDD supply rail 10.

Individual circuit elements used to form the integrated circuit may be connected either to the VDD supply rail 10 and the VSS supply rail 15 as per the example of the circuit element 30, or to the gated VVDD supply rail 20 and the ground supply rail 15, as per the example of the circuit element 35. Circuit elements such as the circuit element 35 are referred to as power gated circuit elements, since in a power gated mode of operation where the header switches 25 are turned off, those power gated circuit elements are powered off due to the VVDD gated supply rail 20 no longer being connected to the VDD supply rail 10. In contrast, circuit elements such as the circuit element 30 will remain powered on during the power gated mode of operation, and accordingly are sometimes referred to as "always on" circuit elements. The "always on" terminology is a relative term, indicating that those circuit elements are on whilst the power gated circuit elements are powered off, but of course the circuit elements can also be turned off ultimately by turning off the voltage to the supply rails 10, 15.

Figure 1B:
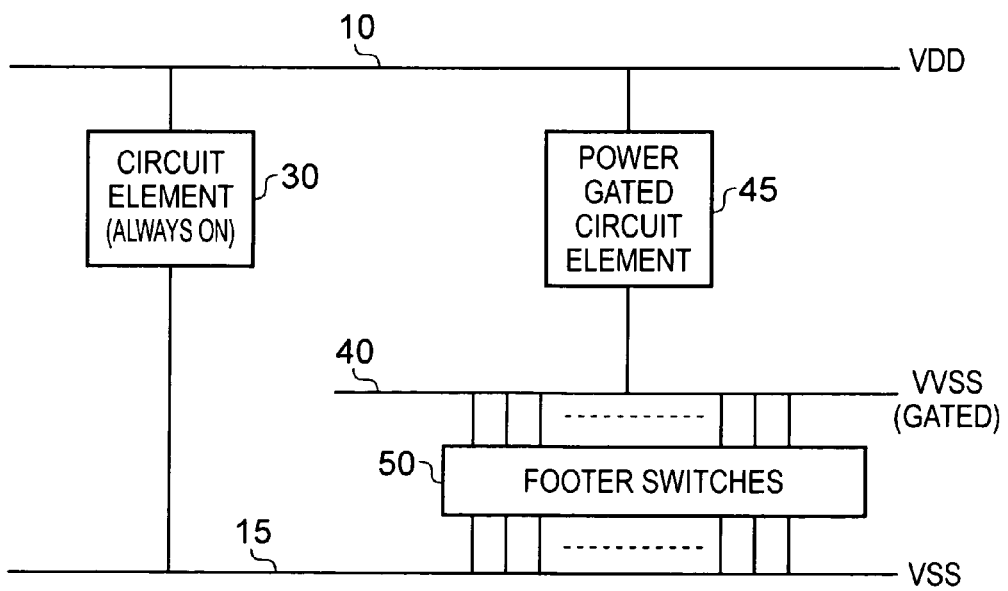

Whilst in one embodiment the integrated circuit may provide a gated VVDD voltage supply rail, in an alternative embodiment as shown in FIG. 1B the integrated circuit may be arranged to provide a gated ground supply rail VVSS 40. Footer switches 50 are used to selectively connect or disconnect the VVSS gated supply rail 40 to the VSS ground rail 15, in one embodiment the footer switches 50 being formed by a plurality of NMOS transistors in parallel. As before, certain circuit elements 30 may be connected between the VDD supply rail 10 and the VSS supply rail 15. In addition, power gated circuit elements such as the illustrated power gated circuit element 45 may be connected between the VDD supply rail 10 and the VVSS gated supply rail 40. In the power gated mode of operation, the footer switches 50 are turned off, disconnecting the VVSS rail 40 from the ground rail 15, and accordingly turning off the power gated circuit elements 45.

Figure 2:
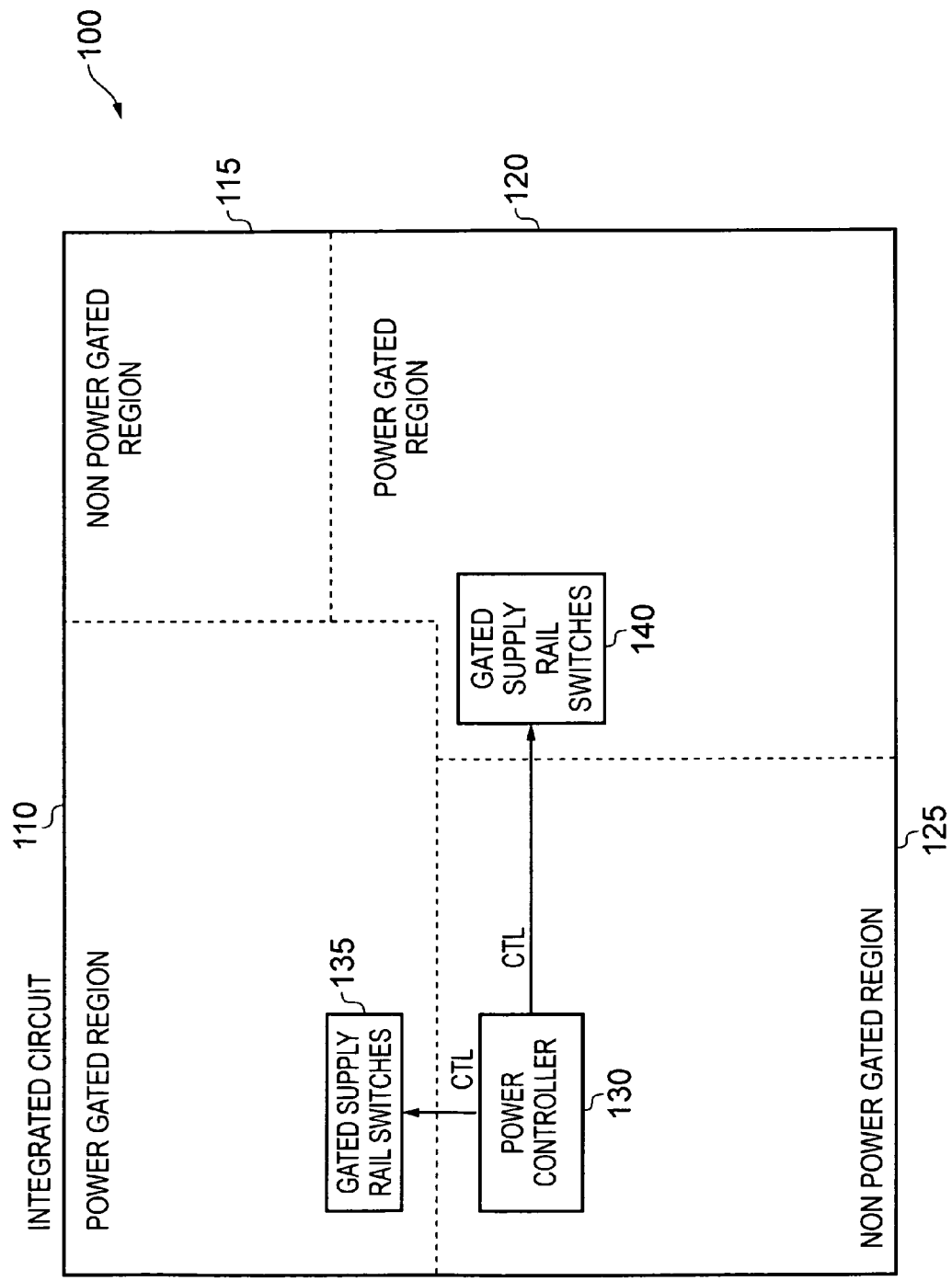
FIG. 2 schematically illustrates the establishment of power gated regions within an integrated circuit.

FIG. 2 schematically illustrates an integrated circuit 100 logically divided into a number of separate regions, including various non power gated regions 115, 125, and various power gated regions 110, 120. Power controller circuit 130 will typically reside within a non power gated region 125 of the integrated circuit 100, and will issue control signals to gated supply rail switches 135, 140 associated with each of the power gated regions 110, 120. For an integrated circuit providing a gated VDD supply rail, the gated supply rail switches 135, 140 will be header switches, whilst for an integrated circuit providing a gated VSS supply rail, those gated supply rails switches 135, 140 will be footer switches. Typically, such gated supply rail switches are considered to reside within the associated power gated region.

Whilst in the non power gated regions 115, 125 all of the circuit elements provided therein will be connected to the non gated supply rails, and hence will remain on during the power gated mode of operation, various of the circuit elements within each power gated region 110, 120 can be connected between the gated supply rail generated via the associated gated supply rail switches, 135, 140 and the relevant non-gated supply rail. Accordingly any such circuit elements connected in that manner will be turned off during the power gated mode of operation. In addition to such circuit elements, it is also often the case that at least some of the circuit elements within the power gated regions 110, 120 remain powered up during the power gated mode of operation, and hence those circuit elements are connected to the VDD and VSS supply rails.

For any power gated circuit element within a power gated region, there is a tendency for the output from that circuit element to float when that circuit element is power gated, whether the output floats or not typically being dependent on the input to that circuit element at the time it is power gated. Whilst this is not an issue if the output from that circuit element is only ever received by other circuit elements that are also power gated, it can become an issue if that output may adversely affect an input to a circuit element that is not being power gated, whether that be a circuit element within one of the power gated regions 110, 120 or one of the circuit elements within a non power gated region 115, 125. In such situations, the floating output voltage could cause incorrect operation of the integrated circuit.

To avoid this scenario, a distribution network of circuit elements can be formed to transmit a particular input signal to any circuit structures containing a power gated circuit element whose output may adversely affect an input to a non power gated circuit element, with that input signal being set to a predetermined static value for the duration of the power gated mode of operation, and with that static value being chosen so as to ensure that the output from the power gated circuit element cannot adversely affect an input to, and hence the correct operation of, the non power gated circuit element. Such an arrangement is shown schematically in FIG. 3.

Figure 3:
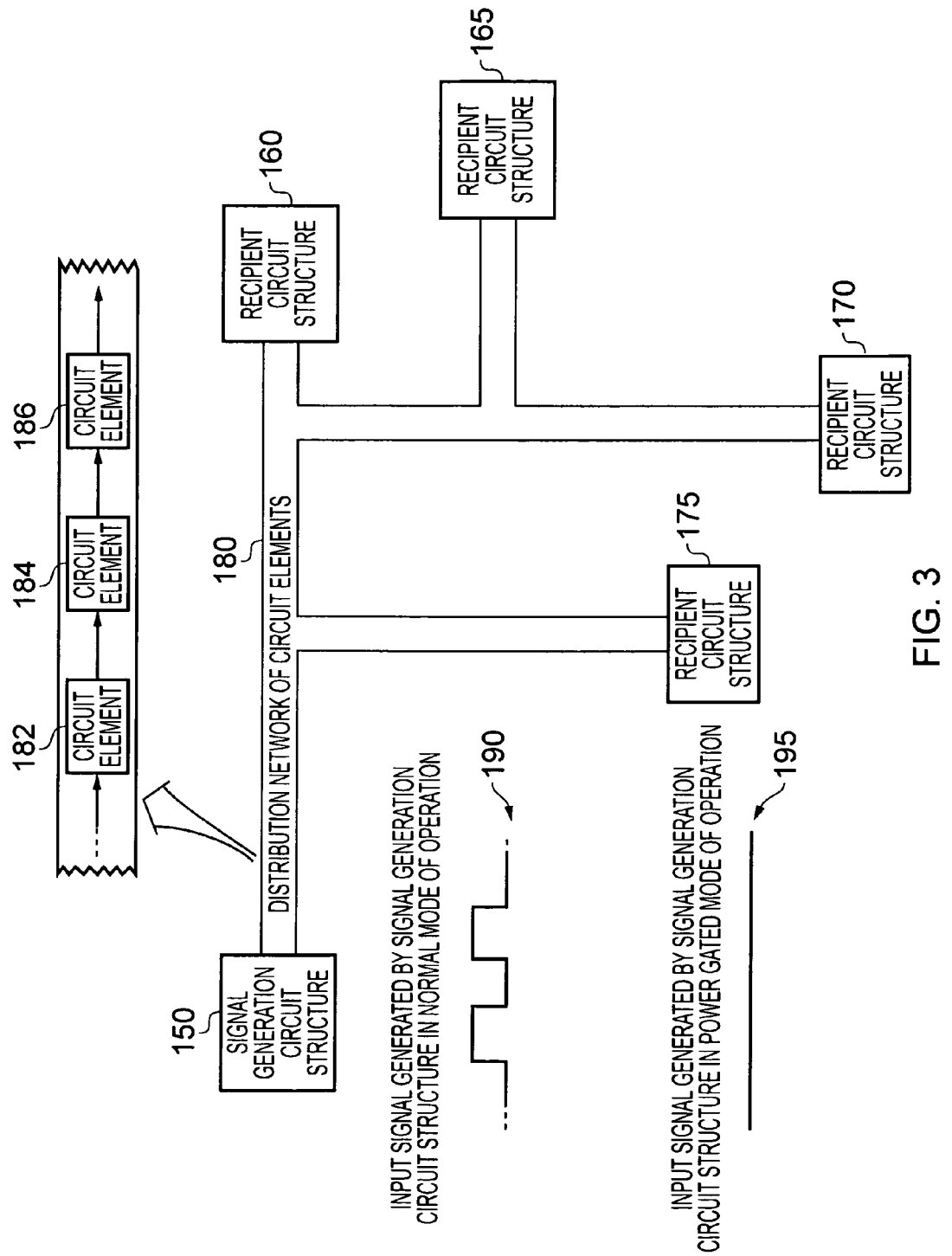
FIG. 3 illustrates the provision of a distribution network of circuit elements in accordance with one embodiment, to distribute an input signal generated by a signal generation circuit structure to various recipient circuit structures.

As shown in FIG. 3, a signal generation circuit structure 150, which itself may contain one or more circuit elements, is arranged to generate an input signal for provision to various recipient circuit structures 160, 165, 170, 175, each recipient circuit structure comprising one or more circuit elements.

During the normal mode of operation, that input signal generated by the signal generation structure 150 may vary, as shown schematically by the signal 190. For example, the input signal generated by the signal generation circuit structure 150 may be a clock signal used to clock certain circuit elements within each of the recipient circuit structures 160, 165, 170, 175. In an alternative embodiment, the input signal generated by the signal generation circuit structure may be a reset signal which is periodically asserted when a reset condition occurs, and following performance of the reset is then cleared.

However, in the power gated mode of operation, the internal structure of each recipient circuit structure 160, 165, 170, 175 is such that the input signal generated by the signal generation circuit structure 150 must remain at a predetermined static value for the duration of the power gated mode of operation (as shown schematically by signal 195), in order to ensure that each recipient circuit structure 160, 165, 170, 175 operates correctly in the power gated mode of operation. For example, the static value of the input signal may be required to ensure that a power gated circuit element within each recipient circuit structure 160, 165, 170, 175 cannot disturb correct operation of a non-power gated circuit element.

The input signal generated by the signal generation circuit structure 150 is routed to each recipient circuit structure 160, 165, 170, 175 by a distribution network 180 of circuit elements. As shown schematically in FIG. 3, the distribution network 180 typically comprises a series of circuit elements 182, 184, 186 used to propagate the input signal from the signal generation circuit structure 150 to each recipient circuit structure.

Typically, it would be the case that all of the circuit elements in the distribution network 180 remain powered during the power gated mode of operation in order to ensure that the correct static value is provided as an input to each recipient circuit structure 160, 165, 170, 175. However, as will be discussed in more detail with reference to the remaining figures, in accordance with the embodiments described herein some of the circuit elements within the distribution network can be power gated without affecting the correct propagation of the static value to the recipient circuit structures. Accordingly, the leakage current that would otherwise be associated with the circuit elements of the distribution network when the integrated circuit is in the power gated mode of operation can be reduced.

The circuit elements within the distribution network 180 can take a variety of forms. However, commonly they will take the form of inverters, such an inverter being illustrated in FIG. 4. In FIG. 4, the inverter consists of a PMOS transistor 200 placed in series with an NMOS transistor 205 between the VDD supply rail 210 and the VSS (ground) supply rail 215. Accordingly, if a logic zero value is received at the input X, this will cause the PMOS transistor 200 to turn on and the NMOS transistor to turn off, hence causing the output Y to be pulled to the VDD voltage level. Similarly, if a logic one value is provided at the input X this will turn off the PMOS transistor 200 but turn on the NMOS transistor 205, accordingly causing the output Y to be pulled to the VSS voltage level.

As illustrated in FIG. 5A if the integrated circuit is of the form discussed earlier with reference to FIG. 1A where the power gated supply rail is a power gated VDD supply rail, then any inverter in the distribution network whose input is guaranteed to be at a logic one level in the power gated mode of operation can be connected between the gated VVDD supply rail 220 and the VSS ground supply rail 215. In particular, since in the power gated mode of operation a static value is propagated over the distribution network, there will be a significant number of inverters for which this condition is true, and accordingly any of those circuit elements can be connected to the gated VVDD supply rail as shown in FIG. 5A. As is apparent from FIG. 5A, the output under these circumstances will never float, since the logic one input value will turn on the NMOS transistor 205, and cause the output to be pulled to the VSS voltage level of the ground rail 215, which is a non-gated rail. If the distribution network 180 consists entirely of a series of inverters, it will be appreciated that every other inverter will meet this condition with regards to input value, and accordingly can be power gated in the power gated mode of operation, thereby reducing the leakage current associated with distribution network by half.

If instead the integrated circuit has the form illustrated earlier with reference to FIG. 1B, where the gated supply rail is a gated VVSS supply rail, then the technique can still be used, but in this instance is used in association with any inverter that receives at its input a logic zero level during the power gated mode of operation, when the static value is being propagated to the recipient circuit structures. As shown in FIG. 5B the inverter is connected between the VDD supply rail 210 and the gated VVSS rail 225. Even though the inverter is power gated, its output cannot float, since the logic zero input will ensure that the PMOS transistor 200 is turned on, and the output is hence pulled to the voltage of the VDD supply rail 210, which is a non-gated supply rail.

Figure 6A:
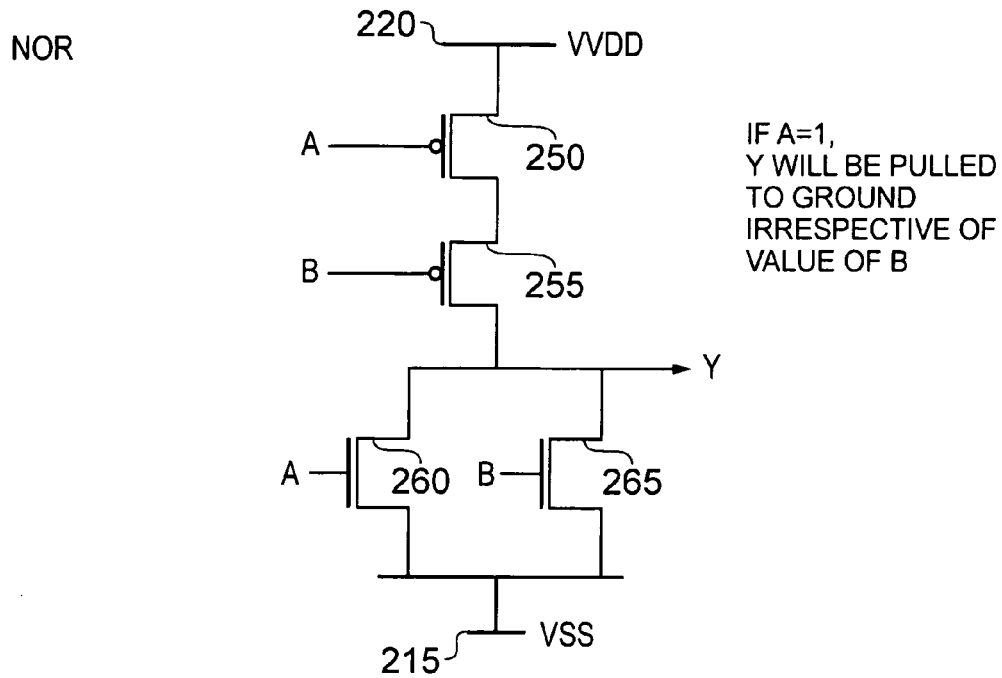
FIGS. 6A and 6B illustrate NOR and NAND circuit elements that can be provided for one or more of the circuit elements within the distribution network, and indicate the situation in which those circuit elements can be power gated whilst still allowing the static value produced by the signal generation circuit structure to be distributed to the recipient circuit structures during the power gated mode of operation.

It should be noted that this technique does not only work for inverters, and there is no requirement that the distribution network is formed entirely of inverters. Indeed, it may be the case that certain other signals are introduced into the distribution network at certain points along the distribution path, and hence certain of the circuit elements may take the form of combinatorial circuits such as NOR gates or NAND gates. FIG. 6A illustrates a NOR gate structure consisting of two PMOS transistors 250, 255 in series, which are then also connected in series with a pair of NMOS transistors 260, 265 in parallel. It will be appreciated that if either or both of the input signals A and B are at a logic one value, this will cause the output Y to be pulled to the VSS level, i.e. the logic zero value level. However, if both of the signals A and B are at logic zero level, the output Y will be drawn towards the VDD logic level during normal operation. However, for any NOR gate which is guaranteed to have one of its inputs, for example the input A, at a logic one value during the power gated mode of operation when the static value is being propagated over the distribution network, the NOR gate could be connected to the gated VVDD rail 220 rather than the non-gated VDD rail since one of the NMOS transistors 260, 265 will be turned on, and accordingly the output value Y will be pulled to the VSS rail 215, which is non-gated, and accordingly the output value Y will be at a logic zero level and will not float.

Figure 6B:
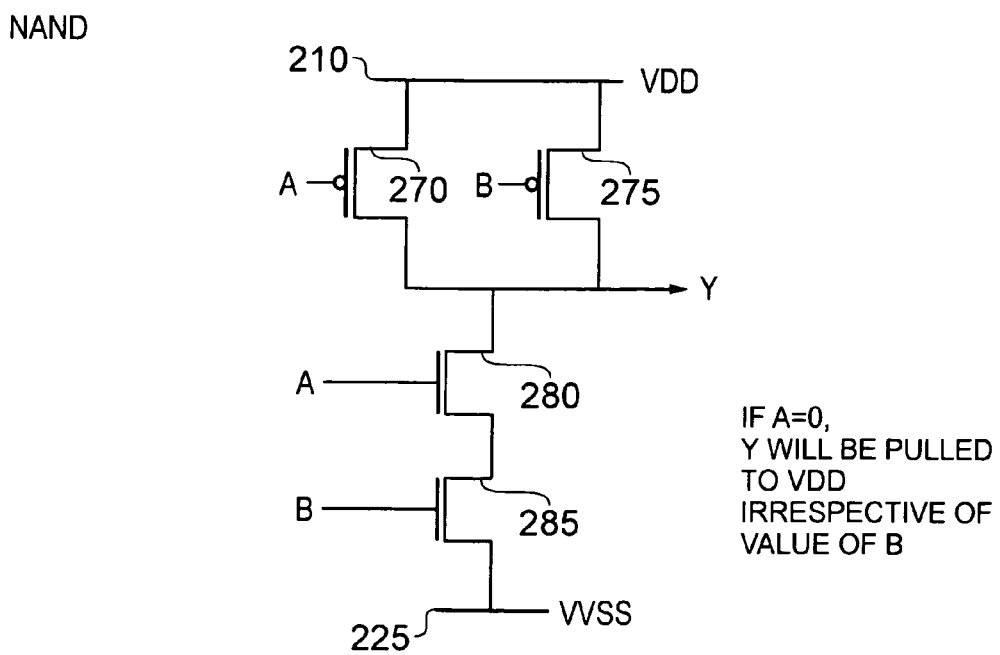

For integrated circuits that employ a gated VVSS rail rather than a gated VVDD rail, a similar technique can instead be used for any NAND gate structures within the distribution network. Such a NAND gate structure is shown in FIG. 6B. In this example, if both of the inputs A and B are at a logic one value, this will turn on both NMOS transistors 280, 285 and cause the output value Y to be drawn to the ground level. However, if either or both of the inputs are at a logic zero level, this will not occur, and instead one or both of the PMOS transistors 270, 275 will turn on and pull the output Y towards the VDD voltage level. Accordingly, if in the power gated mode of operation where the static value is being distributed, it can be guaranteed that one of the inputs to the NAND gate will be at a logic zero value, then the NAND gate could be connected to the VDD supply rail 210 and to the gated VVSS supply rail 225, without any risk of the output value Y floating. Instead, the output value Y will be drawn to the logic one level provided by the non-gated VDD supply rail 210.

Figure 7:
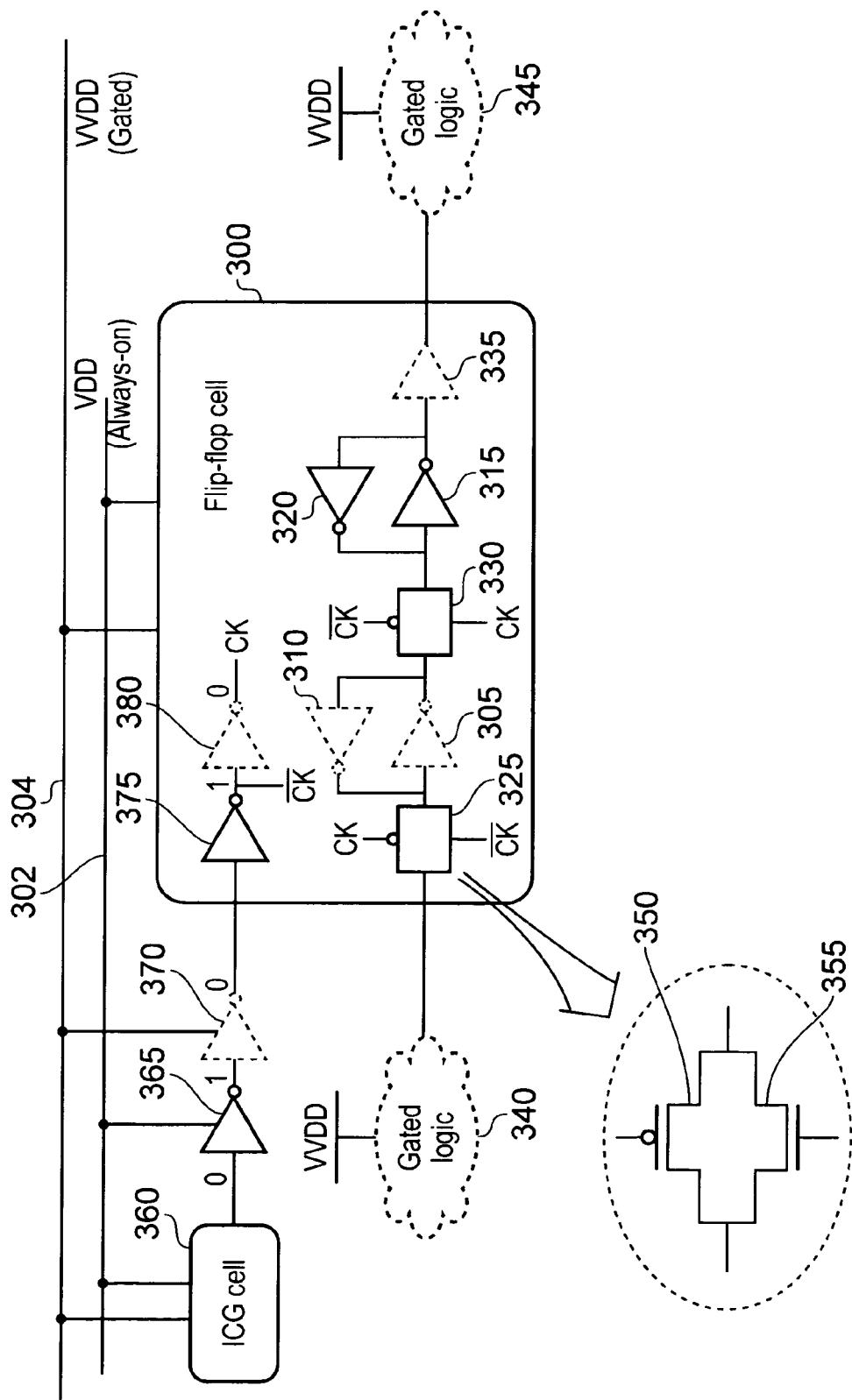
FIG. 7 illustrates a particular embodiment where the signal generation circuit structure is an integrated clock gating structure and the recipient circuit structure is a flip-flop cell, in a situation where the gated supply rail gated VDD supply rail.

FIG. 7 illustrates a particular example where the signal generation circuit structure 150 is an integrated clock gating (ICG) cell 360 and the recipient circuit structure is a flip-flop cell 300. In this example, it is assumed that the integrated circuit provides a gated VVDD supply rail 304 in addition to the non-gated VDD supply rail 302. The distribution network 180 consists of a series of inverters 365, 370, 375, 380 providing a clock signal to the flip-flop cell. Whilst only two inverters 365, 370 are shown external to the flip-flop cell 300, more inverters will typically be provided, although the number will typically be an even number to ensure that the same value as output from the ICG cell 360 is received at the interface of the flip-flop cell 300. In this case, an end portion of the distribution network, formed by the inverters 375, 380, extends into the flip-flop cell itself, with the output from the inverter 375 forming the inverted clock signal, and the output from the inverter 380 forming the clock signal.

The flip-flop cell 300 consists of a master latch formed by the inverters 305, 310 and a slave latch formed by the inverters 315, 320. Coupling circuits 325, 330 are provided, each being formed by a PMOS transistor 350 placed back to back with an NMOS transistor 355. The clock signal and inverted clock signal are provided to the coupling circuits as shown in FIG. 7. As a result, it will be appreciated that when the clock signal is low, and hence the inverted clock signal is high, the coupling circuit 325 will be turned on to connect the master latch 305, 310 to the output from the gated logic 340. Similarly when the clock signal is high the coupling circuit 325 will be turned off, but instead the coupling circuit 330 will be turned on, connecting the output of the master latch 305, 310 to the input of the slave latch 315, 320. As also shown in FIG. 7, a buffer circuit 335 (typically formed by a pair of inverters in series) is provided to propagate the output from the flip-flop cell 300 to the gated logic 345.

In a power gated mode of operation, the gated logic circuits 340, 345 are turned off. In addition, the master latch 305, 310 and the buffer 335 within the flip-flop cell 300 are turned off. However, the slave latch 315, 320 remains powered, and operates as a retention latch to retain a data value within the flip-flop cell.

To ensure that the output from the gated master latch 305, 310, which may float during the power gated mode of operation, cannot corrupt the state in the slave latch 315, 320, it is important to ensure that the coupling structure 330 continues to disconnect the master latch. It is for this reason that the distribution network 365, 370, 375, 380 is used to propagate a static logic zero value of the clock signal from the ICG cell 360 to the flip-flop cell in the power gated mode of operation, the ICG cell 360 being configured so that it will continue to generate a logic zero value for the duration of the power gated mode of operation.

Such a form of flip-flop cell 300 is referred to as an unprotected live-slave retention register, and is a useful mechanism for providing state retention in an area and performance sensitive design where the additional cost of a separate state retention latch cannot be accommodated. However, as discussed above, to ensure correct operation of the flip-flop cell 300 in the power gated mode of operation where the slave latch is operating as a retention latch, it is important for the static logic zero value of the clock to be propagated from the ICG cell 360 to the flip-flop cell. Traditionally, this has meant that all the inverters in the distribution network 365, 370, 375, 380 have remained powered in the power gated mode of operation. However, due to the techniques discussed earlier, wherever there is an inverter whose input will be at a logic one value for the duration of the power gated mode of operation, as is the case in FIG. 7 for the two inverters 370, 380, those inverters can be connected to the gated VVDD supply rail 304 rather than the VDD supply rail 302, and accordingly are powered off during the power gated mode of operation. This significantly reduces the leakage current associated with the distribution network, without any adverse effect on correct operation, since it can still be guaranteed that the logic zero clock value output by the ICG cell 360 will be propagated to the flip-flop cell 300.

In the example of FIG. 7 such an approach provides a significant reduction in leakage current within each flip-flop cell 300. In particular, whereas there would previously have been four live inverters within the flip-flop cell during the power gated mode of operation, in accordance with the described embodiment the inverter 380 is turned off, thereby leaving only three live inverters 315, 320, 375, and thus reducing the leakage of the cell by 25%. Given that there could potentially be a large number of such flip-flop cells 300 within any particular integrated circuit, it will be appreciated that the potential leakage current reductions are significant, and occur in addition to the leakage current reductions achieved in the external parts of the distribution network illustrated schematically by the inverters 365, 370 in FIG. 7.

Figure 8:
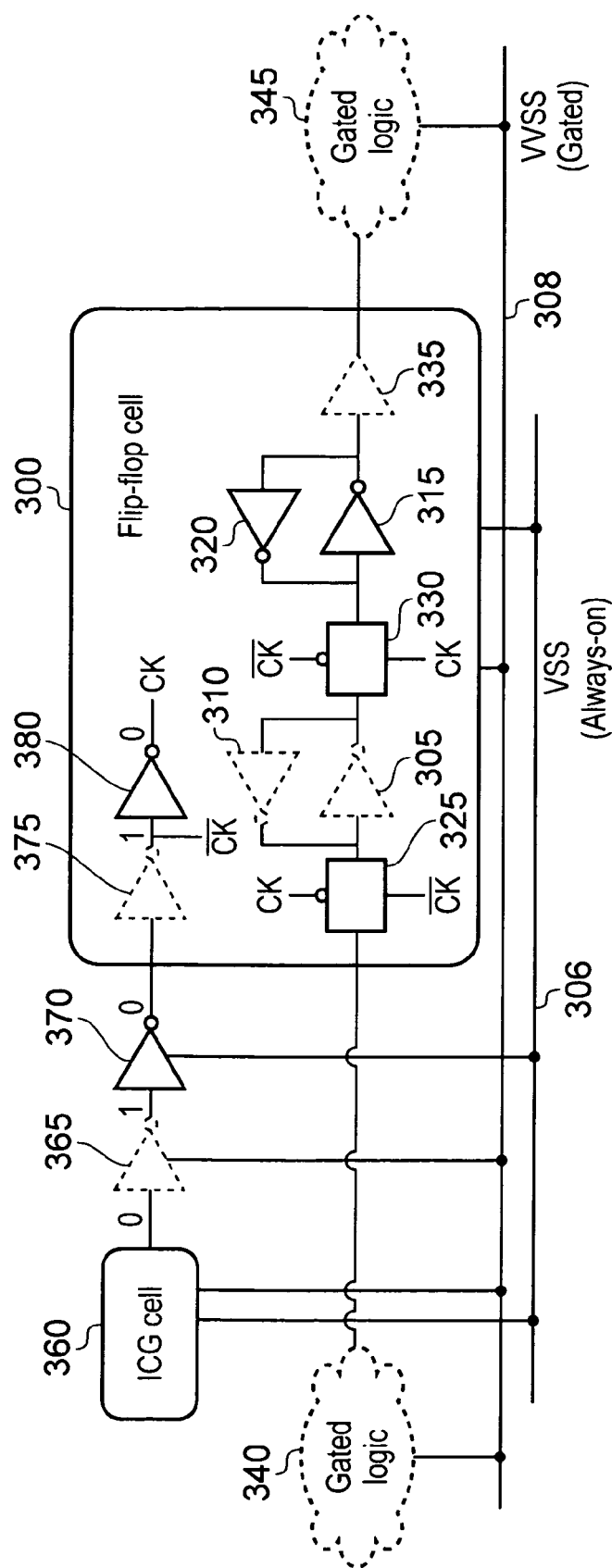
FIG. 8 illustrates a particular embodiment where the signal generation circuit structure is an integrated clock gating structure and the recipient circuit structure is a flip-flop cell, in a situation where the gated supply rail is a gated ground supply rail.

FIG. 8 illustrates the same form of ICG cell 360 and flip-flop cell 300, but within an integrated circuit where the gated supply rail is a gated ground rail 308 provided in addition to the non-gated ground rail 306. In this embodiment, as described earlier with reference to FIG. 5B, it is the inverters 365, 375 within the distribution network that are guaranteed to have a logic zero input in the power gated mode of operation that are connected to the virtual ground rail 308, and accordingly are power gated during the power gated mode of operation.

Figure 9:
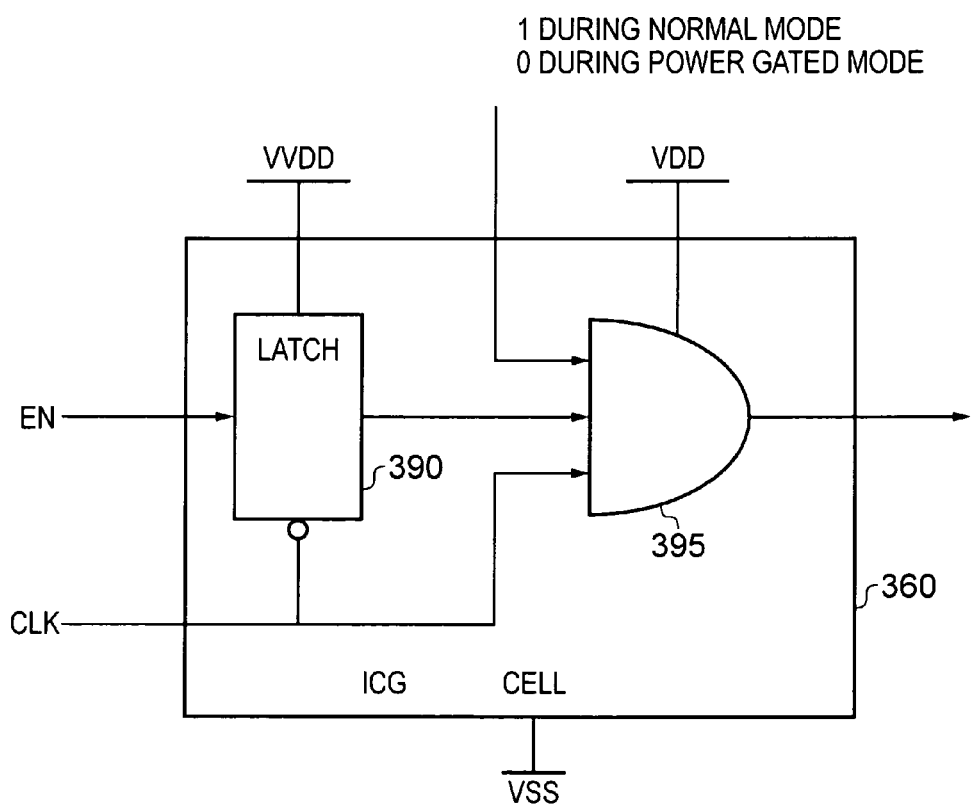
FIG. 9 schematically illustrates components that may be provided within the integrated clock gating cell of FIG. 7 or 8 in accordance with one embodiment.

FIG. 9 schematically illustrates one form of ICG cell 360 that can be used in the earlier embodiments of FIG. 7 or 8. In particular, a latch 390 receives an inverted version of a clock signal, with the non-inverted clock signal being provided as one input of an AND gate 395. The latch 390 then latches an enable signal on the rising edge of the clock signal. Accordingly, it will be seen that when the enable signal is asserted, then this will result in a logic one value being output from the latch 390 to the AND gate 395. During normal mode of operation, the third input to the AND gate is also at a logic one value, and accordingly the clock signal is merely propagated from the ICG cell 360 via the AND gate 395. When the circuit elements clocked by the ICG cell are not required, dynamic power can be saved by merely de-asserting the enable signal and hence turning the clock signal off.

In one embodiment, the latch 390 may be connected to the gated VVDD rail (assuming an integrated circuit of the form shown in FIG. 7—in the embodiment of FIG. 8, it could have been connected to the gated VVSS rail) and accordingly there is a possibility that the latch's output will float when in the power gated mode of operation. However, the AND gate 395 is connected to the non-gated VDD rail, and accordingly remains powered in the power gated mode of operation. Further, the top input to the AND gate 395 is configured to be driven to a logic zero value during the power gated mode, hence ensuring that a logic zero value is asserted from the ICG cell 360 for the duration of the power gated mode of operation, and hence ensuring that the required static value of the clock signal is propagated to each flip-flop cell 300 during the power gated mode of operation.

Figure 10:
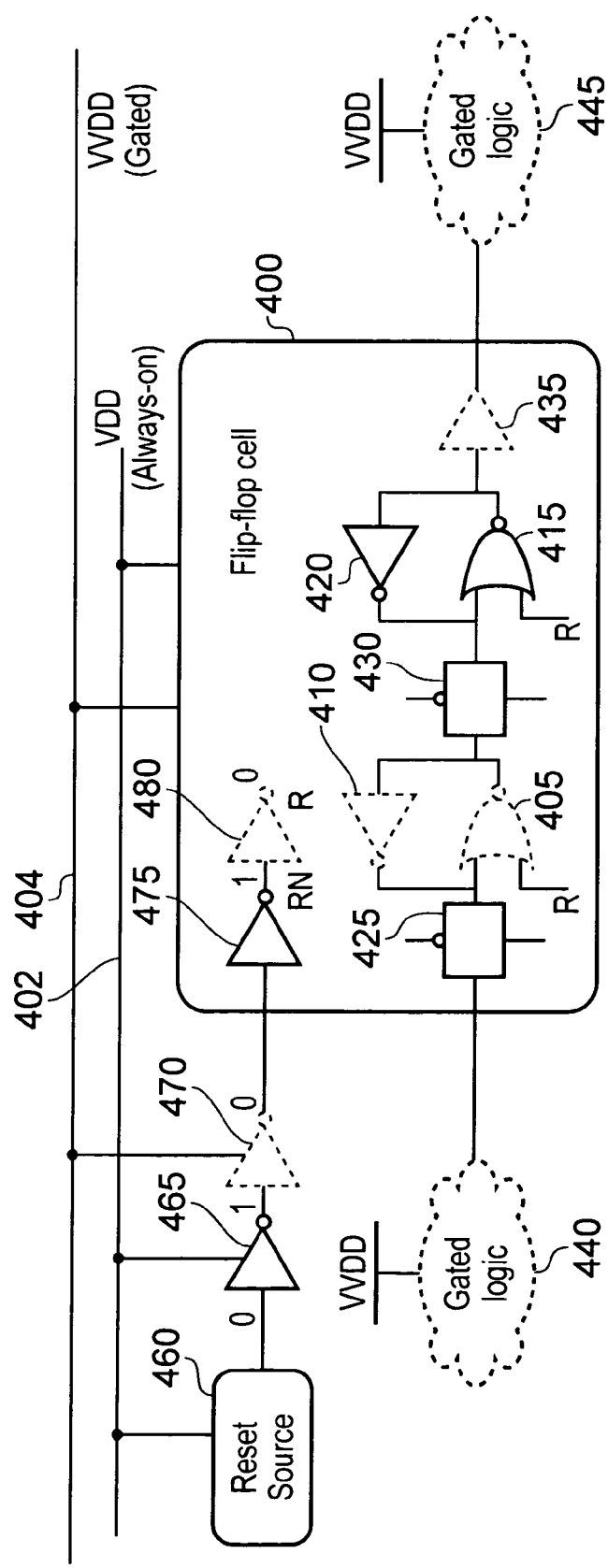
FIG. 10 illustrates an alternative embodiment where the signal generation circuit structure is a reset source and the recipient circuit structure is a flip-flop cell.

FIG. 10 illustrates a similar arrangement to FIG. 7, but where the signal generation circuit structure 150 takes the from of a reset source 460 providing a reset signal propagated over a distribution network 465, 470, 475, 480 to the flip flop cell 400. The flip-flop cell is similar to the one described in FIGS. 7 and 8, but each of the master and slave latches also receives a reset signal R. Accordingly, the inverters 305, 315 of the FIG. 7 embodiment are replaced with NOR gates 405, 415 in the embodiment of FIG. 10. Thus, when the reset signal R is not asserted (and hence is at a logic zero value), each of the NOR gates 405, 415 operates as an inverter. However, when the reset signal is asserted, this forces the output of each NOR gate 405, 415 to a logic zero value irrespective of the other input.

During the power gated mode of operation where the slave latch 415, 420 is operating as a state retention latch, it is accordingly important to ensure that the reset input cannot float, and potentially cause the retained state to be corrupted. To achieve this, the reset source 460 is configured to generate a logic zero static value for the duration of the power gated mode of operation, with that static value being propagated via the distribution network 465, 470, 475, 480 to the flip-flop cell 400, thereby ensuring that the reset signal is maintained at a logic zero value.

Typically, the reset source will be provided externally to the power gated region, and accordingly will be connected to the VDD rail, but not to the VVDD rail. In one embodiment, the ultimate source of the reset signal may be external to the integrated circuit, and hence the reset source may be associated with an interface pin of the integrated circuit.

Whilst the embodiment of FIG. 10 shows an end portion 475, 480 of the distribution network within the flip-flop cell 400, in an alternative embodiment these components may be omitted, and the distribution network may terminate at the flip-flop cell boundary.

In one particular embodiment, in the power gated mode of operation, the flip-flop cell may receive a static logic zero reset signal from a reset source via an associated distribution network 465, 470, 475, 480, and also receive a static logic zero clock signal from an ICG cell via an associated distribution network, such as that shown in FIG. 7. In this instance, both distribution networks can benefit from the leakage current reduction techniques described earlier, giving further enhanced leakage current reductions.

FIG. 11 illustrates an alternative arrangement where the leakage current reduction techniques of the described embodiments can be utilised. In this instance the signal generation circuit structure 150 takes the form of the power controller 130 discussed earlier with reference to FIG. 2, and the distribution network circuit elements comprises a series of inverters 570, 572, 574, 576 distributing a power control signal (PMAIN) to the main switches 515 which operate in combination with the starter switches 500 to provide the header switches 25 illustrated earlier with reference to FIG. 1A. Hence, the main switches form the recipient circuit structure. When it is desired to turn on the gated VVDD rail 535, a PSTART signal is asserted at a logic zero value from the power controller and is routed via a series of inverters 560, 562 to the gate of a plurality of PMOS transistors 510 forming the starter switches. Whilst for clarity only one PMOS switch is shown, there will typically be multiple PMOS transistors in parallel to form the starter switches. Similarly, whilst two PMOS switches 520, 525 are shown for the main switches 515, this is merely intended to show that the main switches are stronger than the starter switches, and again there may be multiple PMOS switches in parallel forming the main switches 515.

When the starter switches are turned on, they will begin to draw the voltage on the VVDD rail 535 towards the VDD voltage level of the VDD rail 530. Once the voltage on the VVDD line 535 has reached a suitable level (e.g. 90% of the full VDD level), the PMAIN signal will be asserted at a logic zero value and routed via the series of inverters 570, 572, 574, 576 to the gates of the PMOS transistors forming the main switches 515, hence turning those main switches on. This will then serve to bring the voltage on the VVDD rail 535 quickly up to the full VDD voltage level. The reason for operating the starter switches 500 and main switches 515 in this way is to avoid the situation where all of the header switches are turned on at once, placing a spike in demand on the voltage supply, and causing a temporary drop in the voltage level of the VDD rail 530.

When it is desired to disconnect the VVDD rail 535 from the VDD rail 530, then both the PSTART and the PMAIN signals will be set to a logic one value, thereby turning off both the starter switches and the main switches. Considering in particular the PMAIN signal, this will be maintained at the logic one level for the entirety of the power gated mode of operation, and accordingly the input to each of the inverters 570, 572, 574, 576 will remain static for the entirety of the power gated mode of operation. Accordingly, using the earlier described principles, each of the inverters 570 and 574 can be connected to the VVDD rail 535 such that they are turned off in the power gated mode of operation. Even though the inverters 570, 574 are power gated, they will continue to produce a logic zero output for the reasons discussed earlier with reference to FIG. 5A, and hence the main switches will remain turned off for the entirety of the power gated mode of operation.

When the power gated mode of operation is exited, the starter switches 500 will be turned on first, hence starting to draw the voltage on the VVDD line 535 back towards the VDD level. Typically the voltage on the VVDD rail 535 will have reached approximately 90% of the full VDD level before the PMAIN control signal is asserted at a logic zero value to turn on the main switches, and accordingly at this time all of the inverters 570, 572, 574, 576 will be sufficiently powered to operate correctly and propagate the logic zero value on to the gates of the main switches 515.

Accordingly, the above described technique can be used to reduce the leakage current in the distribution network formed by the inverters 570, 572, 574, 576 when in the power gated mode of operation.

Figure 12A:
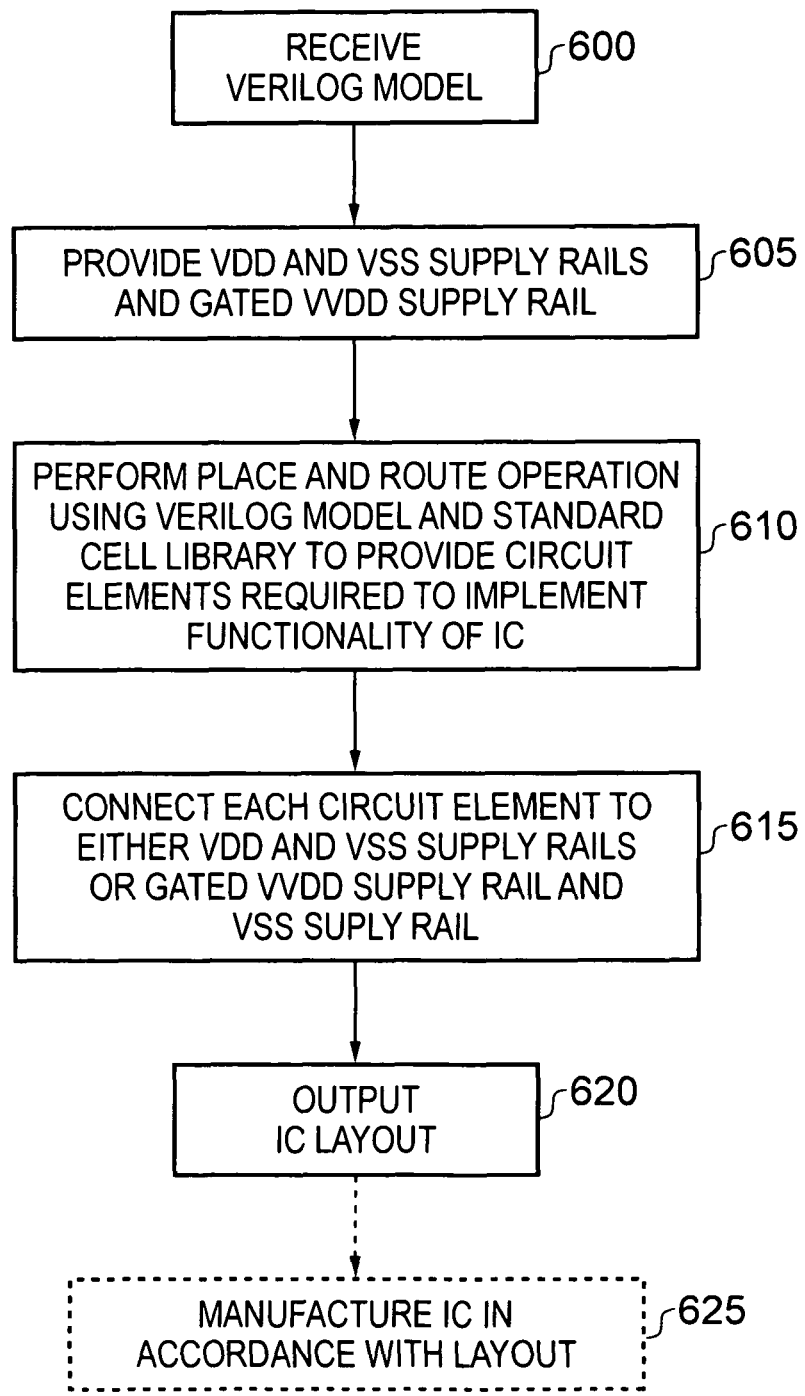
FIGS. 12A and 12B illustrate a method for generating a layout of an integrated circuit in accordance with one embodiment, where for each circuit element in the distribution network it is determined whether to connect that circuit element to a gated voltage supply or a non-gated voltage supply.
Figure 12B:
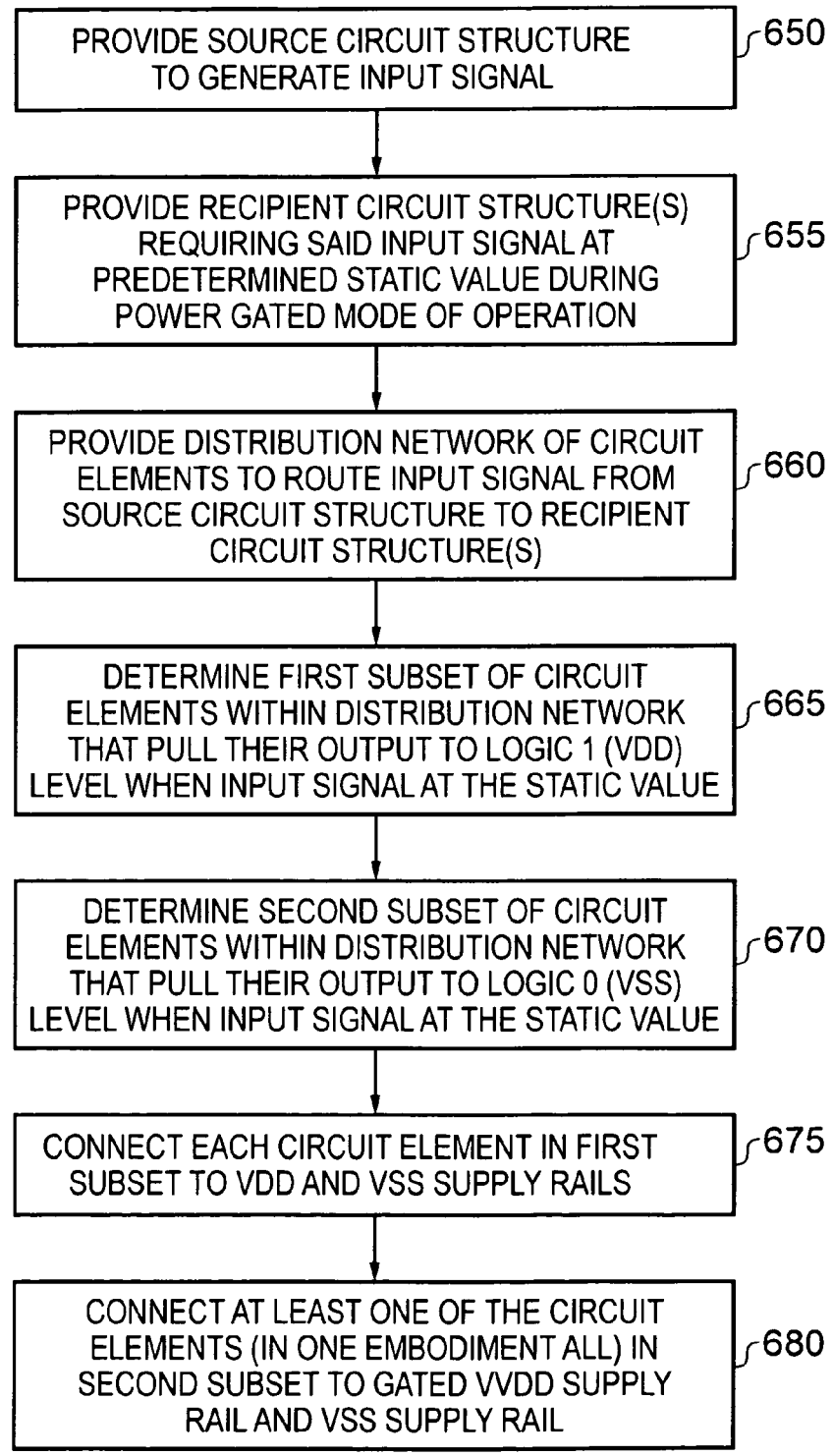

FIGS. 12A and 12B illustrate a method that can be employed to produce the layout of an integrated circuit in accordance with one embodiment. With the exception of the final step 625 indicated by a dotted box, the steps of FIG. 12A may be performed by a place and route tool, which may take the form of software executing on a computer. A step 600, a Verilog model 600 is input to the place and route tool, specifying a gate level functional representation of the desired integrated circuit. At step 605, the place and route tool establishes VDD and VSS supply rails, along with a gated VDD supply rail. Thereafter, at step 610, a place and route operation is performed using the Verilog model and a standard cell library defining standard cells used as the basic building blocks for establishing the circuit elements required to perform the functionality of the integrated circuit specified by the Verilog model. This process will be well understood by those skilled in the art, and accordingly will not be discussed further herein.

At step 615, each circuit element will be connected to either the VDD and VSS supply rails or to the gated VVDD supply rail and VSS supply rail, in order to implement the power gated functionality specified for the integrated circuit by the Verilog model. Thereafter, the integrated circuit layout can be output at step 620. Outputting of this generated integrated circuit layout can take a variety of forms, but it will typically be recorded as layout data on a computer readable medium.

Optionally, and not shown in FIG. 12A, the layout data output at step 620 can be subjected to standard verification tests, to ensure that the place and route process has not introduced any unexpected anomalies. As shown by the dotted box 625, the process can then continue with the manufacture of the integrated circuit in accordance with the layout output at step 620.

FIG. 12B illustrates some of the steps performed in order to implement the processes of steps 610 and 615 of FIG. 12A in accordance with one embodiment. In particular, at step 650 a source circuit structure is provided within the layout to generate a desired input signal for a number of recipient circuit structures. At step 655, the desired recipient circuit structures are then provided, these recipient circuit structures requiring the input signal to be at a predetermined static value during a powered gated mode of operation.

At step 660, a distribution network is provided within the layout, the distribution network consisting of a series of circuit elements used to route the input signal from the source circuit structure to the required recipient circuit structures.

At step 665, it is determined which circuit elements within the distribution network pull their output value to a logic one level when the input signal is at the static value, these circuit elements being considered to form a first subset of the circuit elements. Similarly at step 670, it is determined which circuit elements within the distribution network pull their output to a logic zero level when the input signal is at the static value, these circuit elements being considered to form a second subset of the circuit elements.

At step 675, each circuit element in the first subset is connected to the VDD and VSS supply rails, since those circuit elements need to have power maintained to them during the power gated mode of operation. However, at step 680, at least one (and in one embodiment all) of the circuit elements in the second subset are connected to the gated VVDD supply rail and the VSS supply rail since those circuit elements can be power gated in the power gated mode of operation whilst still enabling the required static value to be propagated to the recipient circuit structures.

Figure 13:
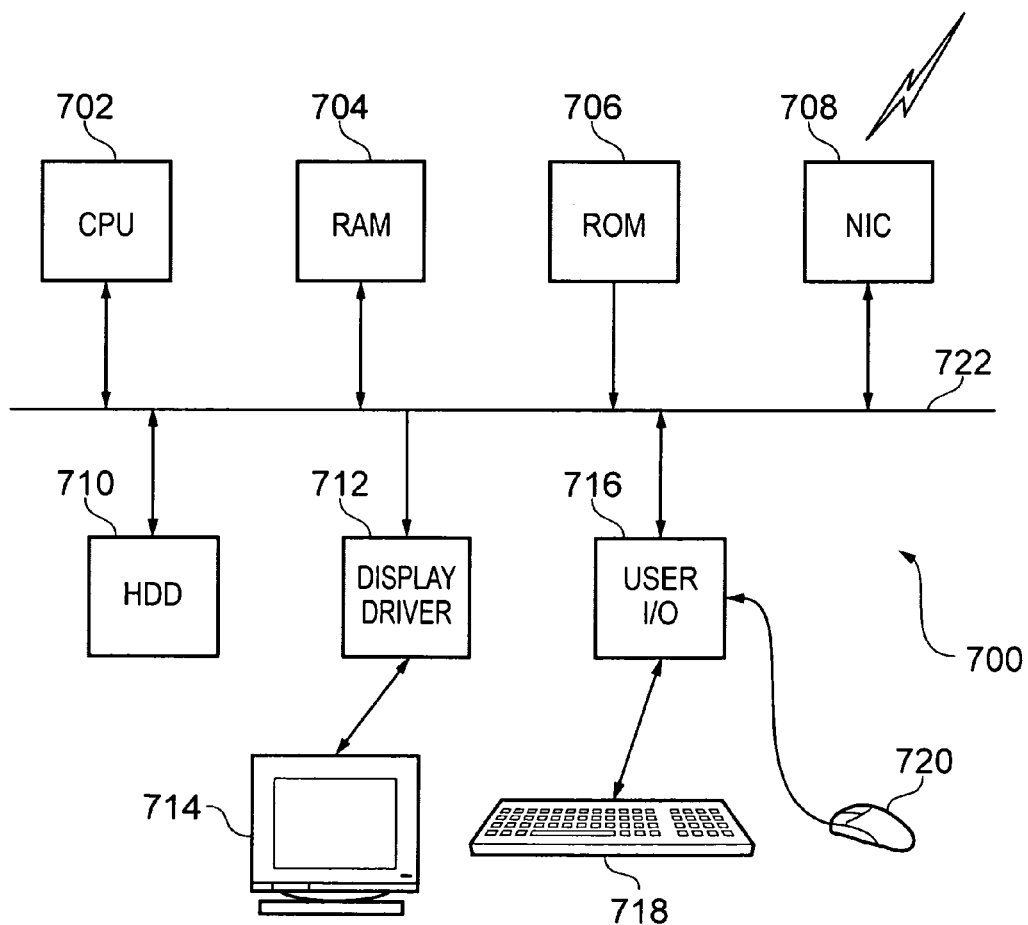
FIG. 13 schematically illustrates the arrangement of a computer that can be configured to execute a computer program to implement the method of FIGS. 12A and 12B with accordance of one embodiment.

FIG. 13 schematically illustrates a general purpose computer 700 of the type that may be used to implement the above described place and route operations in order to generate a layout of an integrated circuit. The general purpose computer 700 includes a central processing unit 702, a random access memory 704, a read only memory 706, a network interface card 708, a hard disk drive 710, a display driver 712 and monitor 714 and a user input/output circuit 716 with a keyboard 718 and mouse 720 all connected via a common bus 722. In operation, the central processing unit 702 will execute computer program instructions that may be stored in one or more of the random access memory 704, the read only memory 706 and the hard disk 710 or dynamically downloaded via the network interface card 708. The results of the processing performed may be displayed to a user via the display driver 712 and the monitor 714. User inputs for controlling the operation of the general purpose computer 700 may be received via the user input/output circuit 716 from the keyboard 718 or the mouse 720. It will be appreciated that the computer program could be written in a variety of different computer languages. The computer program may be stored and distributed on a recording medium or dynamically downloaded to the general purpose computer 700. When operating under control of an appropriate computer program, the general purpose computer 700 can perform the above described place and route operations in order to generate the layout of the integrated circuit, and hence can be considered to form an apparatus for performing the above described operations. The architecture of the general purpose computer 700 could vary considerably and FIG. 13 is only one example.

From the above embodiments it will be appreciated that such embodiments provide a mechanism for reducing leakage current within a distribution network required to propagate a predetermined static value to various recipient circuit structures during a power gated mode of operation.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. An integrated circuit comprising:
   a first voltage supply rail configured to provide a first voltage level;
   a second voltage supply rail configured to provide a second voltage level;
   a gated voltage supply rail configured during at least one mode of operation of the integrated circuit to be connected to said first voltage supply rail, and configured during a power gated mode of operation of the integrated circuit to be disconnected from said first voltage supply rail;
   a plurality of circuit elements, at least one of the circuit elements being connected to said first voltage supply rail and said second voltage supply rail such that said at least one of the circuit elements remains powered during said power gated mode of operation, and at least one other of the circuit elements being connected to said gated voltage supply rail and said second voltage supply rail such that said at least one other of the circuit elements is powered off during said power gated mode of operation;
   a source circuit structure configured to provide an input signal and to maintain said input signal at a static value during said power gated mode of operation;
   at least one recipient circuit structure that requires receipt of said input signal at said static value during said power gated mode of operation; and
   a distribution network of circuit elements configured to route said input signal from said source circuit structure to said at least one recipient circuit structure, said distribution network comprising a first subset of circuit elements and a second subset of circuit elements, when the input signal has said static value, each circuit element in said first subset being configured to pull its output to the first voltage level, and each circuit element in the second subset being configured to pull its output to the second voltage level, each circuit element in said first subset being connected to said first voltage supply rail and said second voltage supply rail, but at least one of the circuit elements in said second subset being connected to said gated voltage supply rail and said second voltage supply rail;
   whereby the distribution network provides the static value to said at least one recipient circuit structure during said power gated mode of operation even though said at least one of the circuit elements in said second subset is powered off during said power gated mode of operation.

2. An integrated circuit as claimed in claim 1, wherein each said at least one recipient circuit structure comprises multiple circuit elements, and at least one of said multiple circuit elements is connected to said gated voltage supply rail and said second voltage supply rail.

3. An integrated circuit as claimed in claim 2, wherein each said at least one recipient circuit structure incorporates an end portion of said distribution network, the end portion of said distribution network comprising at least one of the circuit elements in said second subset.

4. An integrated circuit as claimed in claim 2, wherein each said at least one recipient circuit structure comprises a flip-flop cell comprising as circuit elements a master latch and a slave latch, one of the master latch and the slave latch being connected to said first voltage supply rail and said second voltage supply rail so as to remain powered and act as a retention latch in said power gated mode of operation, and the other of said master latch and said slave latch being connected to said gated voltage supply rail and said second voltage supply rail so as to be powered off during said power gated mode of operation.

5. An integrated circuit as claimed in claim 4, wherein said slave latch acts as said retention latch, and said flip-flop cell comprises a coupling element used to selectively connect the output of the master latch to the input of the slave latch in dependence on a clock signal, the flip-flop cell using said input signal as said clock signal, and said static value of said input signal during said power gated mode of operation causing the coupling element to disconnect the output of the master latch from the input of the slave latch during said power gated mode of operation.

6. An integrated circuit as claimed in claim 4, wherein the master latch and slave latch are configured to receive a reset signal which when asserted resets the stored state of those master and slave latches, the flip-flop cell using said input signal as said reset signal, and said static value of said input signal during said power gated mode of operation ensuring said reset signal is de-asserted during said power gated mode of operation.

7. An integrated circuit as claimed in claim 1, wherein each of the circuit elements in said second subset are connected to said gated voltage supply rail and said second voltage supply rail.

8. An integrated circuit as claimed in claim 7, wherein the circuit elements of said first subset are interleaved with the circuit elements of said second subset, such that every alternate circuit element within said distribution network is connected to said gated voltage supply rail and said second voltage supply rail.

9. An integrated circuit as claimed in claim 1, wherein said source circuit structure comprises multiple circuit elements, and at least one of said multiple circuit elements is connected to said first voltage supply rail and said second voltage supply rail to ensure that said static value is produced during said power gated mode of operation.

10. An integrated circuit as claimed in claim 1, wherein said input signal is generated externally to the integrated circuit and said source circuit structure comprises at least one circuit element connected to said first voltage supply rail and said second voltage supply rail and used to buffer the input signal prior to routing of that input signal via said distribution network.

11. An integrated circuit as claimed in claim 1, wherein said first voltage level is a power supply voltage level and said second voltage level is a ground voltage level.

12. An integrated circuit as claimed in claim 1, wherein said first voltage level is a ground voltage level and said second voltage level is a power supply voltage level.

13. An integrated circuit as claimed in claim 1, further comprising:
a plurality of power switches arranged in parallel between said first voltage supply rail and said gated voltage supply rail, and configured to disconnect the gated voltage supply rail from said first voltage supply rail during said power gated mode of operation;
a subset of said power switches forming said at least one recipient circuit structure; and
said distribution network being configured to provide said input signal as a gate control signal to said subset of said power switches, said static value provided during said power gated mode of operation ensuring that said subset of said power switches are turned off during said power gated mode of operation.

14. A method of generating a layout of an integrated circuit, comprising:
arranging a first voltage supply rail to provide a first voltage level;
arranging a second voltage supply rail to provide a second voltage level;
arranging a gated voltage supply rail to be connected to said first voltage supply rail during at least one mode of operation of the integrated circuit, and to be disconnected from said first voltage supply rail during a power gated mode of operation of the integrated circuit;
providing a plurality of circuit elements, with at least one of the circuit elements being connected to said first voltage supply rail and said second voltage supply rail such that said at least one of the circuit elements remains powered during said power gated mode of operation, and with at least one other of the circuit elements being connected to said gated voltage supply rail and said second voltage supply rail such that said at least one other of the circuit elements is powered off during said power gated mode of operation; and
during said step of providing said plurality of circuit elements, performing the steps of:
arranging a source circuit structure to provide an input signal and to maintain said input signal at a static value during said power gated mode of operation;
providing at least one recipient circuit structure that requires receipt of said input signal at said static value during said power gated mode of operation;
providing a distribution network of circuit elements to route said input signal from said source circuit structure to said at least one recipient circuit structure;
determining a first subset of circuit elements within said distribution network which, when the input signal has said static value, will pull their output to the first voltage level;
determining a second subset of circuit elements within said distribution network which, when the input signal has said static value, will pull their output to the second voltage level;
connecting each circuit element in said first subset to said first voltage supply rail and said second voltage supply rail; and
connecting at least one of the circuit elements in said second subset to said gated voltage supply rail and said second voltage supply rail;
whereby the distribution network provides the static value to said at least one recipient circuit structure during said power gated mode of operation even though said at least one of the circuit elements in said second subset is powered off during said power gated mode of operation.

15. A storage medium providing a computer program which when executed on a computer causes the computer to perform a method of generating a layout of an integrated circuit as claimed in claim 14.

16. An integrated circuit comprising:
first voltage supply rail means for providing a first voltage level;
second voltage supply rail means for providing a second voltage level;
gated voltage supply rail means for connecting to said first voltage supply rail means during at least one mode of operation of the integrated circuit, and for disconnecting from said first voltage supply rail means during a power gated mode of operation of the integrated circuit;
a plurality of circuit element means, at least one of the circuit element means for connecting to said first voltage supply rail means and said second voltage supply rail means such that said at least one of the circuit element means remains powered during said power gated mode of operation, and at least one other of the circuit element means for connecting to said gated voltage supply rail means and said second voltage supply rail means such that said at least one other of the circuit element means is powered off during said power gated mode of operation;
source circuit means for providing an input signal and to maintain said input signal at a static value during said power gated mode of operation;
at least one recipient circuit means that requires receipt of said input signal at said static value during said power gated mode of operation; and
a distribution means formed of circuit element means for routing said input signal from said source circuit means to said at least one recipient circuit means, said distribution means comprising a first subset of circuit element means and a second subset of circuit element means, when the input signal has said static value, each circuit element means in said first subset for pulling its output to the first voltage level, and each circuit element means in the second subset for pulling its output to the second voltage level, each circuit element means in said first subset being connected to said first voltage supply rail means and said second voltage supply rail means, but at least one of the circuit element means in said second subset being connected to said gated voltage supply rail means and said second voltage supply rail means;
whereby the distribution means provides the static value to said at least one recipient circuit means during said power gated mode of operation even though said at least one of the circuit element means in said second subset is powered off during said power gated mode of operation.

\* \* \* \* \*